US 6,543,129 B2

(12) United States Patent
Cachina et al.

(10) Patent No.: US 6,543,129 B2
(45) Date of Patent: Apr. 8, 2003

(54) SOLDER-BEARING CONTACTS AND METHOD OF MANUFACTURE THEREOF AND USE IN A SOLDER BALL GRID ARRAY CONNECTOR

(75) Inventors: Joseph Cachina, Warwick, RI (US); Jack Seidler, Flushing, NY (US); James R. Zanolli, North Smithfield, RI (US)

(73) Assignee: Teka Interconnections Systems, Inc., Warwick, RI (US)

( * ) Notice: Subject to any disclaimer, the term of this patent is extended or adjusted under 35 U.S.C. 154(b) by 24 days.

(21) Appl. No.: 09/801,226

(22) Filed: Mar. 7, 2001

(65) Prior Publication Data

US 2001/0045009 A1 Nov. 29, 2001

Related U.S. Application Data

(60) Continuation-in-part of application No. 08/998,917, filed on Dec. 29, 1997, which is a division of application No. 08/726,960, filed on Oct. 7, 1996, now Pat. No. 5,875,546
(60) Provisional application No. 60/006,205, filed on Nov. 3, 1995.

(51) Int. Cl.⁷ .................................................. H01R 9/00
(52) U.S. Cl. ............................ 29/843; 29/840; 29/842; 29/860; 29/849
(58) Field of Search ........................ 29/843, 842, 840, 29/860

(56) References Cited

U.S. PATENT DOCUMENTS 5,875,546 A * 3/1999 Cachina et al. ............... 29/843

6,000,977 A * 12/1999 Haake .......................... 439/567
6,099,365 A * 8/2000 Cachina et al. ............... 439/83
6,260,264 B1 * 7/2001 Chen et al. ................... 174/260
6,402,574 B2 * 6/2002 Cachina et al. ............... 439/83

FOREIGN PATENT DOCUMENTS

| WO | 96/10279 | 4/1996 | ............ H01R/9/09 |
| WO | 97/16870 | 5/1997 | ............ H01R/9/09 |

* cited by examiner

Primary Examiner—Timothy V. Eley
Assistant Examiner—Alvin J. Grant
(74) Attorney, Agent, or Firm—Darby & Darby

(57) ABSTRACT

The present invention provides a method of forming a solder ball on a portion, e.g., one end, of a contact. In one exemplary embodiment, the contact is a terminal pin which is intended for use in an electrical connector and more particularly, for use in a solder ball grid array (SBGA) connector. Generally and according to one embodiment, the method includes providing the contact along with a solder-holding clip having a body with an opening. The body has a solder-holding conformation adjacent the opening and a solder mass is held by the conformation. The contact is then positioned proximate to the body opening and heat is applied to the solder mass causing the solder to reflow so that the solder flows into a spherical shape. This results in a solder ball being formed on the portion of the contact. Subsequent to forming the solder ball, the solder-holding clip is separated from the contact leaving a contact with a solder ball affixed thereto. Preferably, a series of solder-holding clips are provided along a carrier strip of material so that a number of solder balls may be formed on corresponding contacts during a single reflow operation.

49 Claims, 9 Drawing Sheets

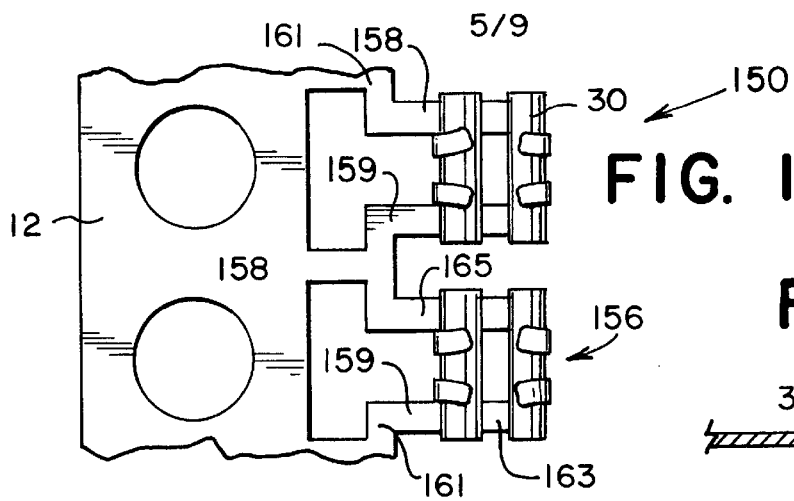
FIG. 10
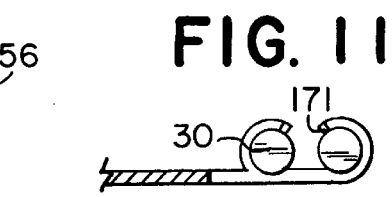
FIG. 11
FIG. 12
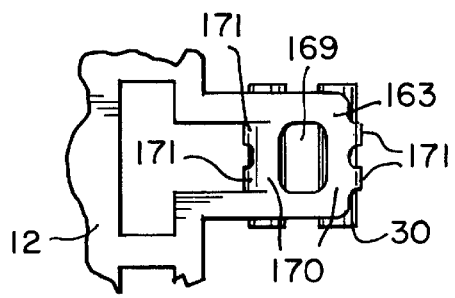
FIG. 13
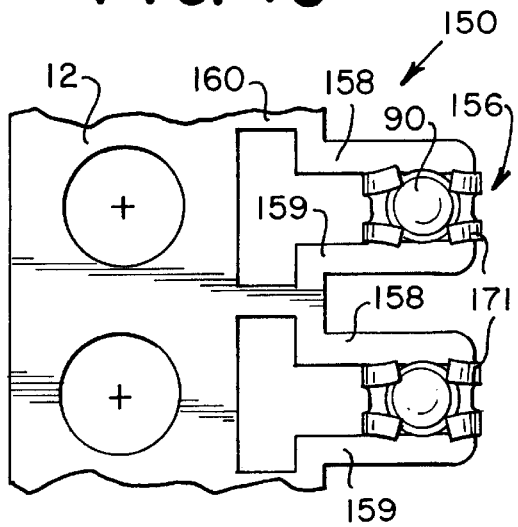
FIG. 14
FIG. 15
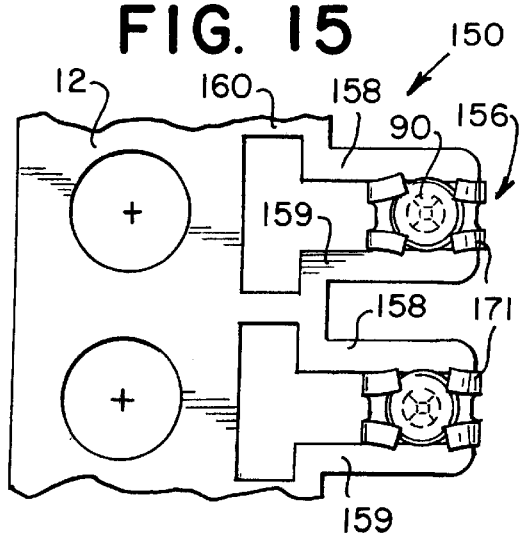
FIG. 16
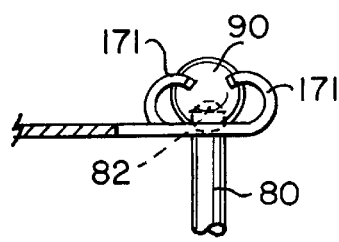

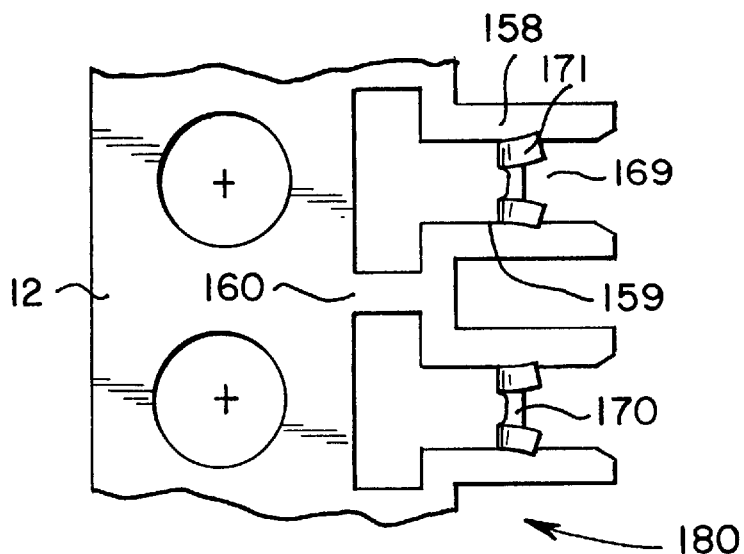
FIG. 23
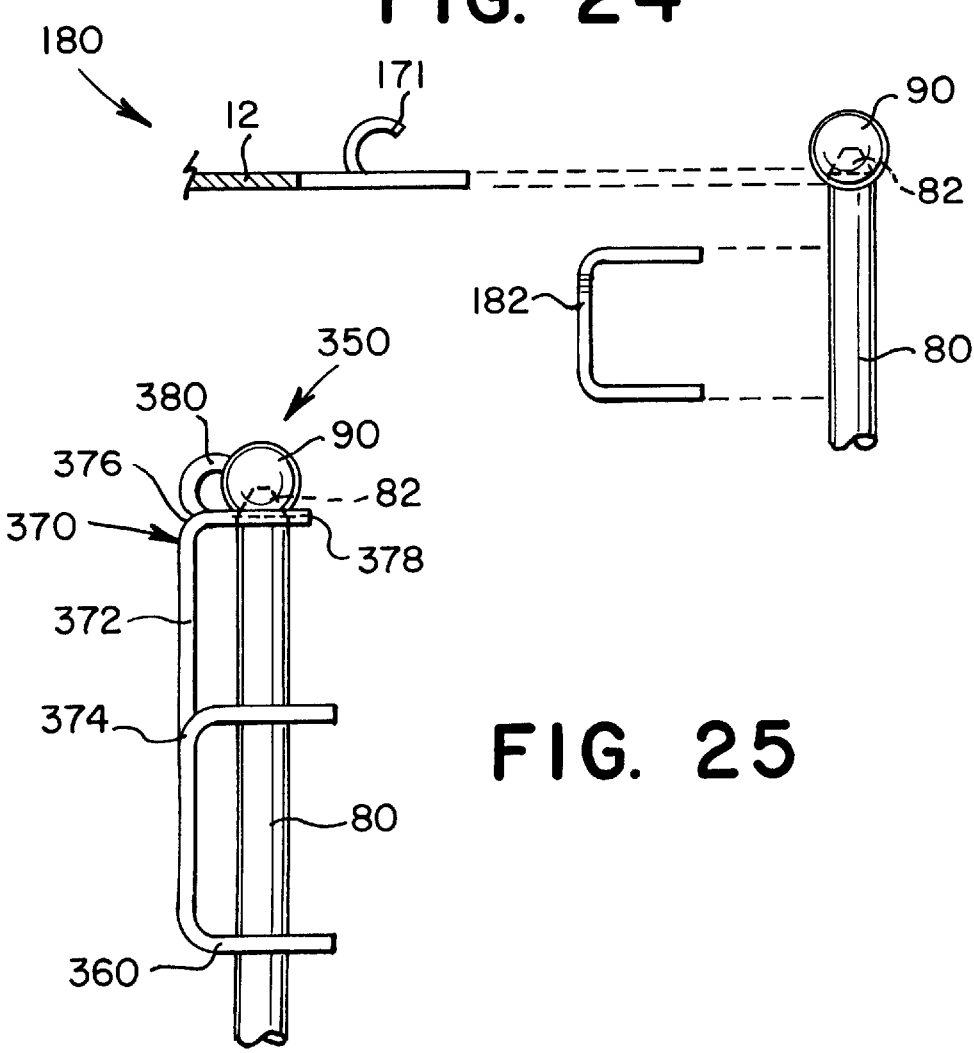
FIG. 24
FIG. 25

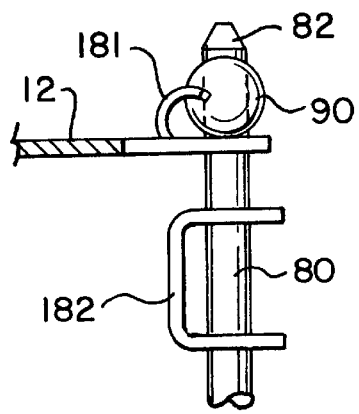
FIG. 29
FIG. 30
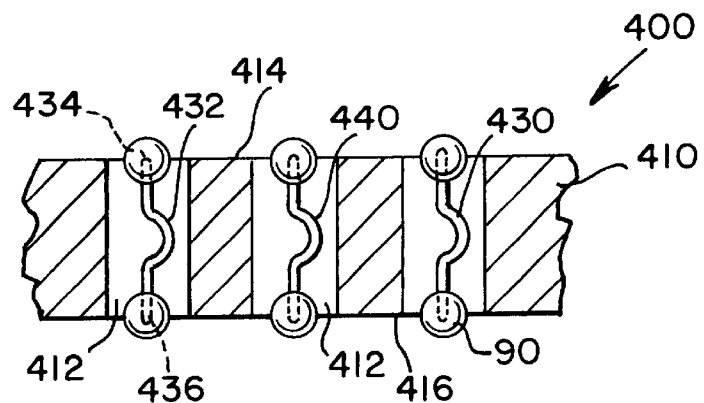
FIG. 31
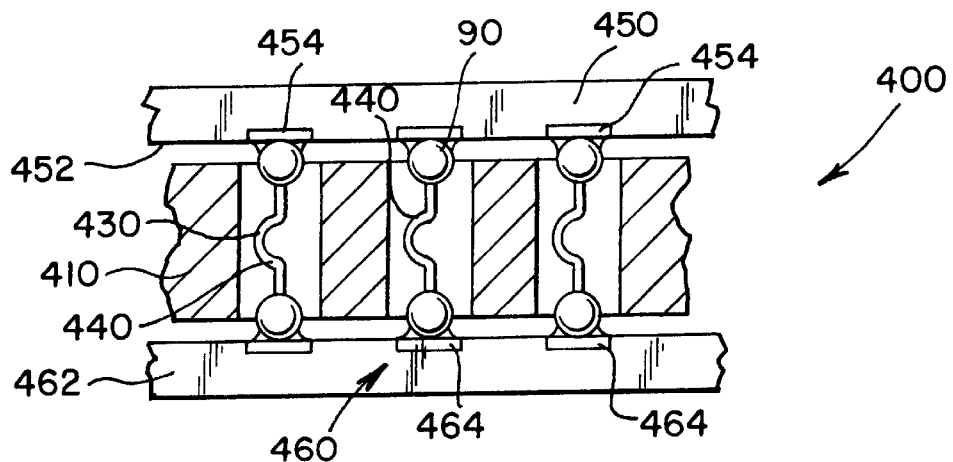

SOLDER-BEARING CONTACTS AND METHOD OF MANUFACTURE THEREOF AND USE IN A SOLDER BALL GRID ARRAY CONNECTOR

CROSS REFERENCE TO RELATED APPLICATIONS

This application is a continuation-in-part of U.S. application Ser. No. 08/998,917, filed Dec. 29, 1997, which is a divisional of U.S. application Ser. No. 08/726,960, filed Oct. 7, 1996 (now U.S. Pat. No. 5,875,546), which claims the benefit of U.S. Application Ser. No. 60/006,205, filed Nov. 3, 1995, all of which are hereby incorporated by reference in their entirety.

FIELD OF THE INVENTION

The present invention relates to the field of devices for joining electrical components to one another and, more particularly, to a method of forming a solder ball on a contact and to a method and apparatus for facilitating the soldering of a first electronic device, such as a connector, to a second electronic device, such as a printed circuit board.

BACKGROUND OF THE INVENTION

It is often necessary and desirable to electrically connect one component to another component. For example, a multi-terminal component, such as a connector, is often electrically connected to a substrate, such as a printed circuit board, so that the contacts or terminals of the component are securely attached to contact pads formed on the substrate and/or to holes lined with an electroplating material in the substrate to provide an electrical connection therebetween. One preferred technique for securely attaching the component terminals to the contact pads and/or plated lining holes is to use a solder material.

When joining a multi-terminal component, such as a connector, to a substrate by soldering, particularly a substrate with internally plated holes, special provisions have often been required, such as shown in U.S. Pat. Nos. 4,597,625; 4,802,862; 4,883,435; 5,139,448; and 5,334,059, all of which are incorporated herein by reference in their entirety. Such components have terminals which do not carry solder, so that these situations have generally required special means for providing solder to the component terminals and to contact pads on the substrate. One approach to providing solder to the component terminals and contact pads is to provide solder paste in and around the particular area, such a hole. However, this approach generally does not provide a sufficient volume; of solder to properly join the component terminals and contact pads.

In the mounting of an integrated circuit (IC) on a substrate (e.g., formed of a plastic or a ceramic), the use of ball grid array (BGA) or other similar packages has become common. In a typical BGA, spherical solder balls attached to the IC package are positioned on electrical contact pads of a circuit substrate to which a layer of solder paste has been applied. The solder paste is applied using any number of techniques, including the use of a screen or mask. The unit is then heated to a temperature at which the solder paste and at least a portion or all of the solder balls melt and fuse to an underlying conductive pad formed on the circuit substrate. The IC is thereby connected to the substrate without need of external leads on the IC.

The BGA concept also offers significant advantages in speed, density, and reliability and as a result, the BGA package has become the packaging option of choice for high performance semiconductors. The inherent low profile and area array configuration provide the speed and density and the solid solder spheres provide enhanced solder joint reliability. Reliability is enhanced because the solder joints occur on a spheroid shape of solid solder. The spheroid shape, when properly filleted, provides more strength than flat or rectangular shaped leads of equivalent area. The solid solder composition provides a more reliable solder joint than conventional stamped and plated leads because there can be no nickel underplate or base metal migration to contaminate or oxidize the solderable surface, or weak intermetallic layers than can form when the solder bonds to a nickel underplate. Further, tin and tin plating processes used on conventional stamped and plated leads have additives than can inhibit solderability. Enhanced solder joint reliability is particularly important to an area array package because the solder joints cannot be visually inspected.

While the use of a BGA connector in connecting the IC to the substrate has many advantages, there are several disadvantages and limitations of such devices. It is important for most situations that the substrate-engaging surfaces of the solder balls are coplanar to form a substantially flat mounting interface so that in the final application, the solder balls will reflow and solder evenly to the planar printed circuit board substrate. If there are any significant differences in solder coplanarity on a given substrate, this can cause poor soldering performance when the connector is reflowed onto a printed circuit board. In order to achieve high soldering coplanarity, very tight coplanarity requirements are necessary. The coplanarity of the solder balls is influenced by the size of the solder balls and their positioning on the connector.

Conventional BGA connector designs attach loose solder balls to the assembled connector. The attachment process requires some type of ball placement equipment to place solder balls on a contact pad or recessed area of the connector that has been applied with a tacky flux or solder paste. The connector then goes through a reflow oven to solder the balls to the contact. The process is slow, sensitive, and requires expensive, specialized equipment.

An example of a BGA type connector is described in U.S. Pat. No. 6,079,991, ('991) to Lemke et al., which is herein incorporated by reference in its entirety. The connector includes a base section having a number of outer recesses formed on an outer surface of the base section. Similarly, the base section also has a number of inner recesses formed on an inner surface of the base section. The inner recesses are designed to receive contacts and the outer recesses are designed to receive solder balls so that the solder balls are fused to bottom sections of the contacts which extend into the outer recesses. The contacts comprise both ground/power contacts and signal contacts with top sections of the contacts providing an electrical connection with an electronic device by known techniques. Another electronic device, e.g., a PCB, is electrically connected to the contacts by soldering the solder balls onto contacts formed on the PCB, thereby providing an electrical connection between the two electronic devices.

While the '991 connector is suitable for use in some applications, it suffers from several disadvantages. First, the connections between the solder balls and the bottom sections of the contacts may lack robustness and durability since the solder balls are simply placed in the outer recesses and then reflowed to form the electrical connection between the contact and one electronic device. Accordingly, only a portion of each solder ball is in contact with the bottom section of one contact before and after the soldering process. Second, because the solder balls are simply inserted into the outer recesses, the solder balls may not be coplanar with one another during the use of the connector and during the reflow process. Another disadvantage of this type of connector is that the solder joints are especially susceptible to fracturing during thermal expansion and cooling. The base section and the printed circuit board typically each has a different coefficient of thermal expansion and therefore when both are heated, one component will expand greater than the other. This may result in the solder joint fracturing because the solder ball is confined within the outer recess and the movement of the end of the contact to which the solder ball is attached is limited due to housing constraints. In other words, the contact is held in place within the housing substrate and only slightly protrudes into the recess where the solder ball is disposed. The contact therefore is effectively held rigid and not permitted to move during the reflow process.

In addition, the costs associated with manufacturing the '991 connector are especially high since the contacts must be placed in the base section and then the individual solder balls must be placed within the outer recesses formed in the base section. A BGA type connector likely includes hundreds of solder balls and thus, the process of inserting individual solder balls into the outer recesses requires a considerable amount of time and is quite costly.

It is therefore desirable to provide a simple and inexpensive way of applying solder to contacts, e.g., terminal pins, which may be readily automated, without requiring separately applying solder paste to the component terminals or to the plated holes or contact pads of the substrate. It is also desirable to provide an alternative device and method for mounting high density electrical connectors on substrates, e.g., PCBs, by surface mounting techniques, e.g., using a ball grid array type connector.

SUMMARY OF THE INVENTION

The present invention provides a method of forming a solder ball on a portion, e.g., one end, of a contact. In one exemplary embodiment, the contact is a terminal pin which is intended for use in an electrical connector and more particularly, for use in a solder ball grid array (SBGA) connector. Generally and according to one embodiment, a solder-holding clip having a body with an opening is provided. The body has a solder-holding conformation adjacent the opening and a solder mass is positioned by the conformation. Preferably, the conformations of all of the embodiments act to hold the solder mass. The contact is then positioned proximate to the body opening and heat is applied to the solder mass causing the solder to reflow so that the solder flows into a spherical shape. This results in a solder ball being formed on the portion of the contact. Subsequent to forming the solder ball, the solder-holding clip is separated from the contact leaving a contact with a solder ball affixed thereto. Preferably, a series of solder-holding clips are provided along a carrier strip of material so that a number of solder balls may be formed on corresponding contacts during a single reflow operation.

According to the present invention, the solder-holding clip is formed of a non-wettable material. This permits the solder to reflow smoothly according to the natural flow tendencies of the solder material. The solder-holding clip is designed so that its geometry permits the solder material to flow naturally upon application of heat into a spherical shape, thereby forming the solder ball. The natural tendency of solder material which is subjected to heat is to reflow into a spherical body because of the various physical and thermal properties of the solder material. For example, the resulting surface tension of the solder material, as it undergoes this reflow operation, directs the solder material into the spherical body so long as its natural flow is unimpeded by any features of the clip. The present invention provides a variety of different types of solder-holding clips which are suitable for use because each clip has features which permit the solder to reflow into a spherical shape.

As previously-mentioned, contacts produced by the method of the present invention find particular utility in SBGA connector applications. An SBGA connector is used to electrically connect a first electronic device to a second electronic device. The connector includes a predetermined number of contacts which are disposed within a housing according to a predetermined arrangement. Each contact has a solder ball formed at one end of the contact and this type of solder ball contact provides the same advantages as other types of conventional solder ball grid array configurations.

The contacts may then be conveniently and easily disposed within openings formed in the housing and the coplanarity of the solder balls is controlled so that substrate-engaging surfaces of the solder balls are coplanar to form a substantially flat mounting interface. An opposite end of each contact is designed so that it may or may not separably connect to a terminal (contact) of the first electronic device and the solder ball formed at the end of the contact is disposed relative to a corresponding contact of the second electronic device. Preferably, the second electronic device is a printed circuit board and the contacts of the device are surface mount contact pads. Accordingly, each solder ball is disposed proximate to and preferably in intimate contact with one surface mount contact pad or solder paste on the pad prior to subjecting the connector to a final reflow operation. In the final reflow operation, each solder ball is heated so that the solder material flows onto and provides a secure electrical connection with the corresponding surface mount contact pad.

In another embodiment, the contacts are not loose but are already disposed within the connector prior to the formation of the solder balls on the ends of the contacts. In this embodiment, the connector is positioned relative to the solder-holding clip structure so that each contact is aligned proximate to one opening of a corresponding solder-holding clip. After a solder ball is formed at the end of each contact as a result of the reflow operation, the connector is removed from the solder-holding clip structure.

The connector of the present invention provides numerous advantages over conventional BGA connectors. For example, the connector of the present invention is a lower cost product that offers superior design and reliability compared to conventional devices. By eliminating the time intensive solder ball attachment process, the manufacturing cost and time are reduced. Quality and reliability are enhanced because the solder balls of the present connector are intimate and positive to the parent contact and lead coplanarity is improved and is more consistent. In another aspect of the present invention, the connector provides a compliant lead.

Thus, the present invention provides a robust solder ball contact by a simple yet effective method which takes advantage of the natural reflow characteristics of the solder material by using a solder-holding clip having a tailored geometry and by positioning the contact proximate to an opening formed in the solder-holding clip.

The above-discussed and other features of the present invention will be appreciated and understood by those skilled in the art from the following detailed description and drawings.

BRIEF DESCRIPTION OF THE DRAWINGS

Objects and features of the present invention will be described hereinafter in detail by way of certain preferred embodiments with reference to the accompanying drawings, in which:

FIG. 10 is a plan view of a fragmentary length of a fifth solder-holding member having solder masses held thereby and for use according to the present invention;

FIG. 11 is a side elevational view of the member of FIG. 10;

FIG. 12 is a fragmentary bottom plan view of the member of FIG. 10;

FIG. 13 is a plan view showing the member of FIG. 10 after solder reflow in which solder balls are formed;

FIG. 14 is a side elevational view of the member of FIG. 13;

FIG. 15 is a plan view showing the member of FIG. 13 with a contact positioned relative thereto;

FIG. 16 is a side elevational view of the device of FIG. 15;

FIG. 23 is a plan view of the member of FIG. 21 after the contact having the solder ball attached thereto has been removed;

FIG. 24 is an exploded side elevational view showing the device of FIG. 23 with a contact carrying member being separated from the contact having the solder ball attached thereto;

FIG. 25 is a side elevational view of a contact having an integral carrier member formed as part thereof;

FIG. 29 is a side elevational view of the member of FIG. 28 after a solder reflow operation has formed a solder ball at a portion of the contact between its ends;

FIG. 30 is a cross-sectional view of a connector according to another embodiment of the present invention in which each contact has a solder ball formed at each end; and FIG. 31 is a cross-sectional view of the connector of FIG. 30 after the solder balls have been subjected to reflow to provide an electrical connection between a first electronic device arid a second electronic device.

DETAILED DESCRIPTION OF THE PREFERRED EMBODIMENT

Figure 1:
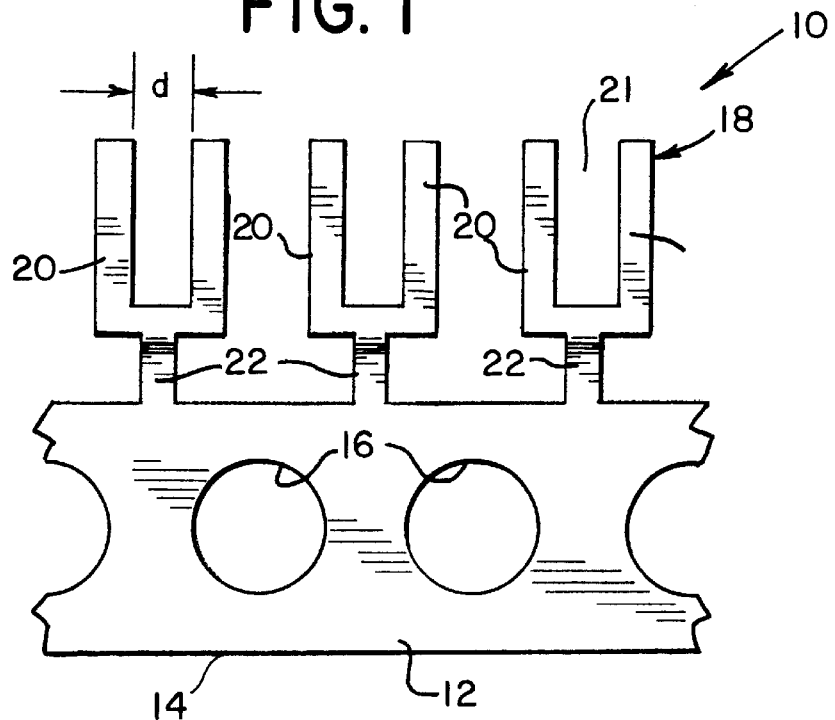
FIG. 1 is a plan view of a fragmentary length of a first solder-holding member for use according to the present invention.
Figure 2:
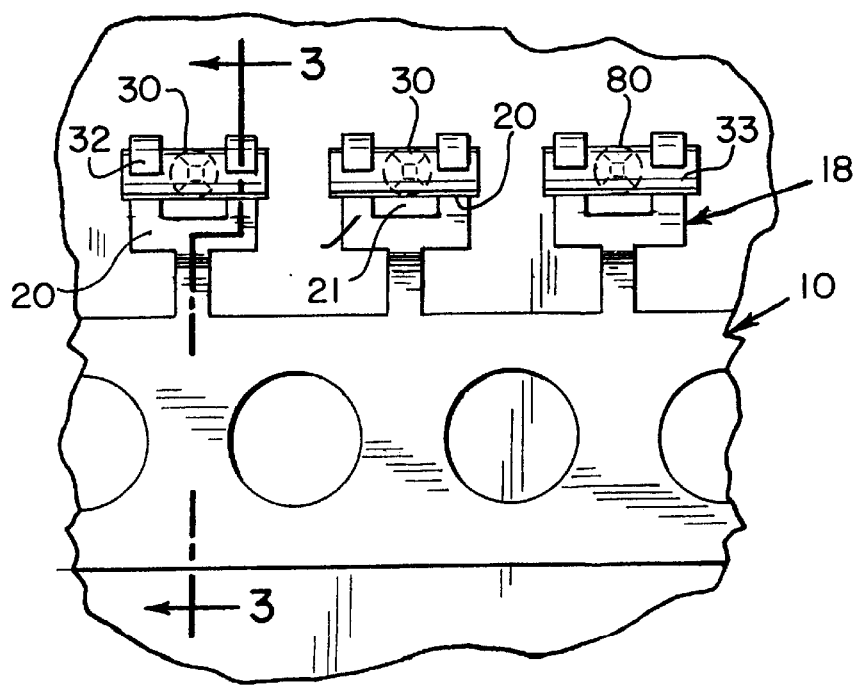
FIG. 2 is a plan view of the member of FIG. 1 holding solder masses for use according to the present invention.
Figure 3:
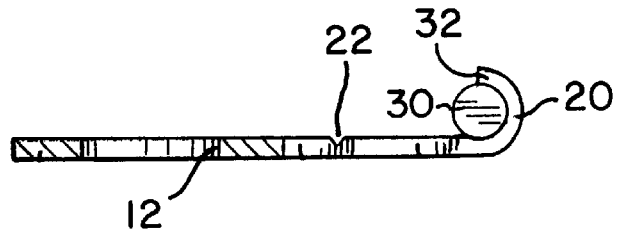
FIG. 3 is a cross-sectional view of FIG. 2 taken along the line 3—3 thereof.

FIGS. 1–3 show a solder-holding member 10 (e.g., a blank) according to a first embodiment of the present invention. As illustrated in FIG. 1, the member 10 is shown in a first position and includes a long planar strip 12 which is formed of a non-wettable material. Suitable non-wettable materials which may be used to manufacture the member 10 include but are not limited to an aluminum based material and any number of plastic materials as well as other materials, such as stainless steel and titanium so long as the material is non-wettable. In one embodiment, the member 10 is formed of an aluminum material which undergoes a stamping process in order to form the structure of FIG. 1. This is preferably done by progressive stamping to produce an array of a large number of repeated blanks which form a carrier for use according to the present invention.

The strip 12 is formed with a longitudinally extending carrier section 14 having customary indexing or sprocket holes 16 spaced along its length, to aid in moving the strip 12 in successive steps through a progressive stamping machine. The carrier strip 12 is integral with individual clips 18 extending laterally therefrom at regular intervals therealong. For example and as will be described hereinafter, the clips 18 may be spaced correspondingly to the spacing of terminals or pins (not shown) on an electrical connector or the like. By way of example only, the clips 18 may be spaced with a pitch of 0.05 or 0.100 inch.

Integrally formed with the carrier strip 12 are a pair of spaced fingers 20 on each clip 18, joined to the carrier strip 12 by a connecting neck member 22. The fingers 20 are spaced apart a predetermined distance coordinated with the width of the pins or terminals (not shown) with which the member 10 is used. A space 21 is formed between the fingers 20.

As shown in FIGS. 2 and 3, a solder mass 30, preferably in the form of a section of solder wire, is placed across the pairs of fingers 20 near first ends 32 thereof. The first ends 32 of the fingers 20 are then rolled partially around the solder mass 30, sufficiently to hold the solder mass 30 in place. This is readily fabricated in the course of progressive stamping, by laying the solder wire 30 (which preferably includes a solder flux) across a number of the clips 18, curling the fingers 20 around the solder wire 30, as shown in FIGS. 2 and 3, and cutting away the solder in the area between the clips 18, leaving one solder mass 30 held by each pair of fingers 20, and of sufficient volume. In this curled second position of the member 10, one solder mass 30 extends across the space 21 between the pair of fingers 20. It will be appreciated that the solder mass 30 is retained at its ends 33 by the rolled fingers 20; however, a central portion of solder mass 30 has no support underneath because the space 21 between the fingers 20 lies underneath the central portion of the solder mass 30.

According to the present invention, a method of forming a solder ball 90 (FIG. 24) on a portion, e.g., one end, of a terminal pin or other type of contact 80 (shown in phantom in FIG. 2) using the member 10 is provided. The present invention is not limited to the use of terminal pins, but rather any number of contact structures, e.g., elongated contact plates, etc., may be used so long as the solder-ball 90 may be formed at an end thereof. Contacts 80 are formed of a conductive material, such as from a metal. Furthermore, the contacts 80 may be in the form of loose pins which are later affixed to a connector (not shown) after the solder-balls 90 are formed thereon or the contacts 80 may already be affixed to the connector. After bending the fingers 20 into the second position shown in FIG. 2 so that the solder masses 30 are retained thereby, contacts 80 are positioned relative to the member 10 so that the ends 82 are positioned either just above or below the solder masses 30.

For example, the ends 82 of the contacts 80 are positioned within the space 21 and below the central regions of the solder masses 30 so that the solder masses 30 lie substantially above the contacts 80. Then, heat is applied to solder masses 30, as by heated air or other conventional means, which causes the solder to reflow. The present applicants have discovered that the geometry of the member 10 and the proper positioning of the contacts 80 directly above or below the solder masses 30, cause the solder to reflow such that the solder ball 90 (FIG. 24) is formed. In other words, the natural flow characteristics, including the resulting surface tension, of the solder material itself causes the solder to be driven into the solder ball 90 which is formed in the space 21 between the fingers 20. Because the contacts 80 are positioned within the spaces 21 between the pairs of fingers 20, a portion of each solder ball 90, which is formed in the space 21, is formed around the end 82 of the contact 80. In other words, the second end 82 is disposed within the solder ball 90.

Upon removing the heat and as soon as the solder reflow is complete, the solder ball 90 is formed and is affixed to the end 82 of each contact 80 as shown in FIG. 24. By forming the member 10 of a material which has non-wettable properties relative to the solder and by constructing clip 18 to have a conducive reflow geometry, the solder reflows according to its natural flow characteristics. As previously-mentioned, the natural flow tendency of solder is to flow into a generally spherical body. This results because of a number of reasons including the surface tension characteristics of the solder mass during the reflow process.

Figure 26:
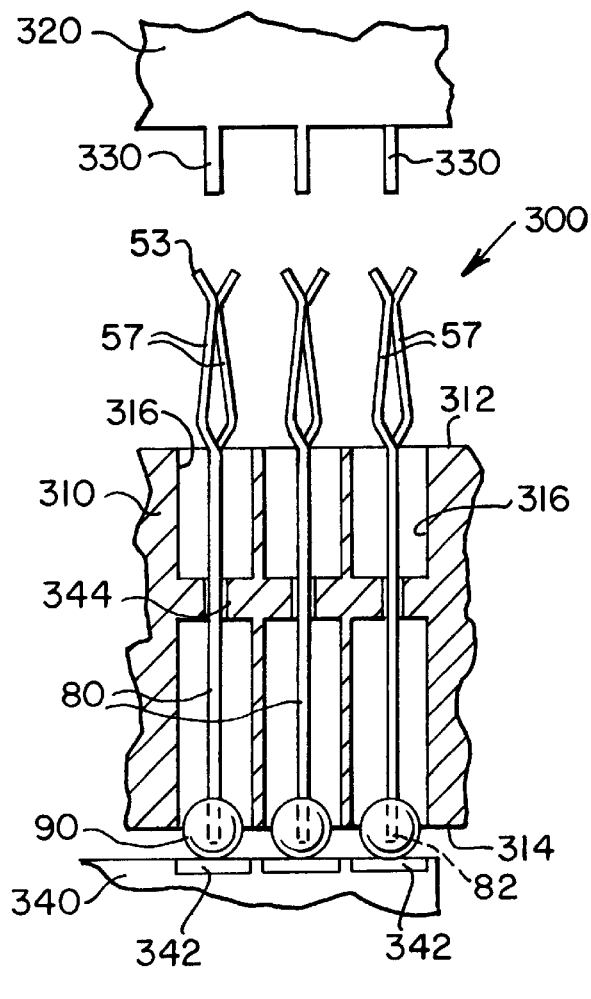
FIG. 26 is a side elevational view of one exemplary connector assembly, wherein a plurality of solder ball carrying contacts are disposed in a connector housing to provide an electrical connection between two electronic devices, partially shown.

Referring now to FIG. 26 in which the contact 80 is shown having a solder ball 90 formed at end 82 thereof. A portion of the solder ball 90 has reflowed around the end 82, thereby securely affixing the solder ball 90 to the contact 80 once the solder cools. According to the present invention, the contact 80 may be used in a connector 300 for electrically connecting a first electronic member 320 to a second electronic device 340. Thus, the method of the present invention provides an effective and easy method for forming contacts 80, e.g., terminal pins, which are particularly suited for use in a solder ball grid array connector (SBGA) 300 (FIG. 26).

The solder ball grid array connector 300 shown in FIG. 26 is merely exemplary in nature. The connector 300 has a predetermined number of terminal pins 80 arranged in a predetermined pattern. Each end 82 of each contact 80 includes one solder ball 90. The connector 300 generally includes a housing 310 having a first surface 312 and an opposing second surface 314. Preferably, the housing 310 is a generally planar member so that the first surface 312 and the second surface 314 are planar surfaces lying substantially parallel to one another. The housing 310 has a plurality of openings 316 formed therein to receive the solder-bearing contacts 80. The openings 316 permit the solder-bearing contacts 80 to extend through the housing 310 so that a first end 53 of the contact 80 preferably protrudes above the first surface 312 to permit the first end 53 to be separably connected to terminals 330 or the like of the first electronic device 320.

In the exemplary embodiment, the first end 53 includes a feature which permits the first electronic device 320 to be separably connected to the solder ball carrying contacts 80 at the first ends 53 thereof. For example, the first end 53 may include a pair of biased contacting forks 57 which receive the terminal 330 of the first electronic device 320. The terminal 330 may be forcibly received between the forks 57 to provide an electrical connection between the terminal 330 and the solder-bearing contact 80. Other types of connecting mechanisms may be provided at first end 53 to provide a separable connection between the first electronic device 320 and the solder-bearing. contacts 80.

The second end 82 of the contact 80 is designed to be electrically connected to a second electronic device 340 to provide an electrical connection between contacts 342 (e.g., surface mount solder pads) of the second electronic device 340 and the solder balls 90 formed at the second ends 82 of the contacts 80. The openings 316 have a width which is greater than the diameter of the solder balls 90, thereby permitting the solder balls 90 to be disposed within the openings 316. In the illustrated embodiment, the second ends 82 extend slightly beyond the second surface 314 of the housing 310. This results in the solder balls 90 being partially disposed within the openings 316 and partially extending beyond the housing 310. The solder-bearing contacts 80 may have other orientations so long as the solder balls 90 are positioned so that they may engage the contacts 342 of the second electronic device 340. The solder-bearing contacts 80 are retained within the openings 316 by any number of techniques. For example, a longitudinal support member 344 may extend each opening 316 with an opening being formed therein to frictionally receive one solder-bearing contact 80 such that the solder-bearing contact 80 is retained in place. The opening formed in the longitudinal support member 344 is actually part of the opening 316 formed in the housing 310.

According to the present invention, the contacts 80 may already be fixedly attached to the connector 300 prior to formation of the solder balls 90 at the second ends 82 of the contacts 80 or the solder balls 90 may be formed on the contacts 80 prior to fixedly attaching the contacts 80 within the connector 300. In the former embodiment, the connector 300 is positioned relative to the member 10 of FIG. 1 so that the second ends 82 extend a sufficient distance from the second surface 314 of the housing 310 to permit the second ends 82 to be aligned underneath the solder masses 30 (FIG. 1). Solder balls 90 are then formed on each second end 82 by the process described hereinbefore. After forming the solder balls 90, the connector 300 is then ready for use in electrically connecting the first electronic device 320 to the second electronic device 340. In the later embodiment, the solder balls 90 are formed on the contacts 80 which are then fixedly attached within the openings 316 of the connector 300 using conventional methods.

The present method of forming the solder balls 90 and the use of the resulting solder ball containing contacts 80 in a solder ball grid array connector (e.g., connector 300) offers a substantial improvement over the conventional method of forming solder balls. As earlier indicated, the previous manner of forming ball grid array (BGA) connectors was to individually insert solder balls into recesses and the like. This is a very time sensitive and costly procedure due to the typical BGA connector including many contacts which each require an individual solder ball. In contrast, the present invention permits the solder balls 90 to be formed during the overall manufacturing process of forming the solder-bearing contacts 80 and assembly of the solder ball grid array (SBGA).

FIG. 26 shows the connector 300 in a position just prior to a final reflow operation which serves to provide a solid electrical connection between the contacts 342 of the second electronic device 340 and the contacts 80, more specifically, the solder balls 90 thereof. In this position, each solder ball 90 is disposed proximate to and preferably in intimate contact with one contact 342. To provide an electrical connection between the first electronic device 320 and the second electronic device 340, the first end 53 of each of the solder ball carrying contacts 80 is separably connected to the first electronic device 320. For example, the first electronic device 320 may include a number of spaced terminals or contact plates 330 which are releasably inserted between the biased forks 57 of the contacts 80 to provide an electrical connection between the first end 53 of each contact 80 and the corresponding terminal or contact 330 of the first electronic device 320.

Figure 27:
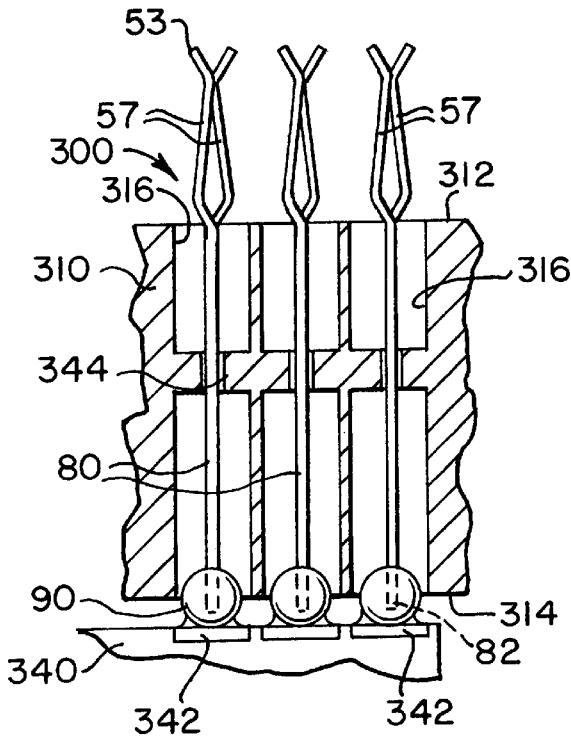
FIG. 27 is a side elevational view of the connector assembly of FIG. 26 after the solder ball carrying contacts have been subjected to a final reflow operation.

An electrical connection is formed between each solder ball 90 and one respective contact 342 of the second electronic device 340 by subjecting the connector 300 to a final reflow operation. In the final reflow operation, the solder balls 90 are heated to a reflow temperature which causes the solder balls 90 to reflow onto the contacts 330. In the instance that the contacts 330 also include a layer of solder material, the final reflow operation causes the solder material to reflow as the solder balls 90 reflow. It will be understood that during the final reflow operation, the second ends 82 of the contacts 80 are still disposed within solder material. Upon completion of the final reflow operation, the solder material is permitted to cool. The result is that a secure, solid electrical connection is formed between the contacts 80 and the contacts 342 of the second electronic device 340 by means of the solder balls 90 which act as a conductive bridge therebetween. FIG. 27 shows the connector 300 and the second electronic device 340 after each solder ball 90 has undergone the final reflow operation and has cooled. For illustration purposes only, the first electronic device 320 is not shown in FIG. 27. It will be understood that the solder balls 90 may or may not significantly deform during the final reflow operation, depending upon the precise application and operation conditions so long as a secure connection results between each solder ball 90 and one contact 342.

The connector 300 of the;present invention offers a number of advantages over conventional BGA connectors, such as the one disclosed in the previously-mentioned U.S. Pat. No. 6,079,991. The electrical connection formed between the solder ball 90 and the contact 342 is more durable and more robust compared to similar connections in conventional devices because the second end 82 of each contact 80 is embedded within the solder ball 90 prior to and after the final reflow operation, which provides the electrical connection between the solder-bearing contact 80 and the contact 342. In comparison, the solder balls used in conventional devices are simply inserted into a recess formed in a substrate of the connector so that a portion of the solder ball rests against one end of one contact. The end of the contact is not embedded within the solder ball and thus during the final reflow operation, the solder ball reflows around only a tip portion of the end of the contact. This may result in less than ideal fusing and robustness between the contact and the solder ball.

During the use of a conventional BGA connector, the physical connection between the contact and the solder ball may fracture resulting in a less than optimum electrical connection formed therebetween because of the fusing characteristics of the solder ball. In contrast, the present invention offers a more durable and robust electrical connection between the solder ball 90 and the second end 82 of the contact 80 because the second end 82 is embedded within the solder ball 90.

In addition, the connector 300 of the present invention offers improved coplanarity of the solder balls 90. It is important for most situations that the substrate-engaging surfaces of the solder balls 90 are coplanar to form a substantially flat mounting interface, so that in the final application, the solder balls 90 reflow and solder evenly to the second electronic device 340, which preferably is in the form of a planar printed circuit board substrate. Because the solder balls 90 are preferably formed as part of the process of manufacturing the contacts 80, the coplanarity of the solder balls 90 in the connector 300 is better controlled. The contacts 80 are inserted and retained within the openings 316 of the housing 310 in such a manner such that the substrate-engaging surfaces of the solder balls 90 are coplanar. In comparison, conventional devices suffered from the disadvantage that often times, the solder balls were not coplanar resulting in poor soldering performance when the connector is reflowed onto the printed circuit board.

Furthermore, the present invention provides a compliant lead because the likelihood that the solder joints will fracture is reduced in comparison with the solder joint configurations of conventional devices. Conventional BGA connector designs result in a construction whereby there is no compliancy to the joint or lead. For example, in some of the conventional devices, the solder balls are retained within recesses formed in the substrate of the connector, and the solder joints are apt to fracture as the components are heated and then cooled because the printed circuit board has a different coefficient of thermal expansion compared to the connector. This difference causes one of these components to expand relative to the other one and can cause fracturing of the solder joints because the solder balls are confined within the recesses of the substrate.

Moreover, the contact 80 is designed to take up the thermal expansion which results during heating of the second electronic device 340 and the connector 300 due to the difference between the coefficients of thermal expansion for each of these components. Unlike in conventional BGA connectors, the contacts 80 of the connector 300 have a range of motion because of their positioning within the housing 310. As shown in FIG. 26, the second end 82 of the contact 80 is disposed in the exemplary housing 310 so that the second end 82 is permitted movement within the opening 316. The second end 82 has a range of movement because it is not constrained within an opening formed in the housing as in conventional connectors. Thus, during the final reflow operation, the contact 80 is permitted some range of motion and is designed to take up the thermal expansion. Accordingly, a more compliant lead is provided.

Furthermore, the connector 300 permits a flux material to be applied to the exterior of the solder ball 90 subsequent to the first reflow operation. The flux material may be applied using any number of techniques, including but not limited to an immersion process. Because the solder balls used in conventional connectors needed to be handled in order to be disposed the balls within the recesses formed in the connector housing, the application of a flux material was not practical. In contrast, the solder balls 90 of the present connector 300 do not need to be handled prior to the final reflow operation and therefore, a flux material may be applied to the solder balls 90 after the balls 90 have been formed. Also, the connector of the present invention is more cost effective because the elimination of the solder ball attach process reduces overall cost and manufacturing time.

Figure 4:
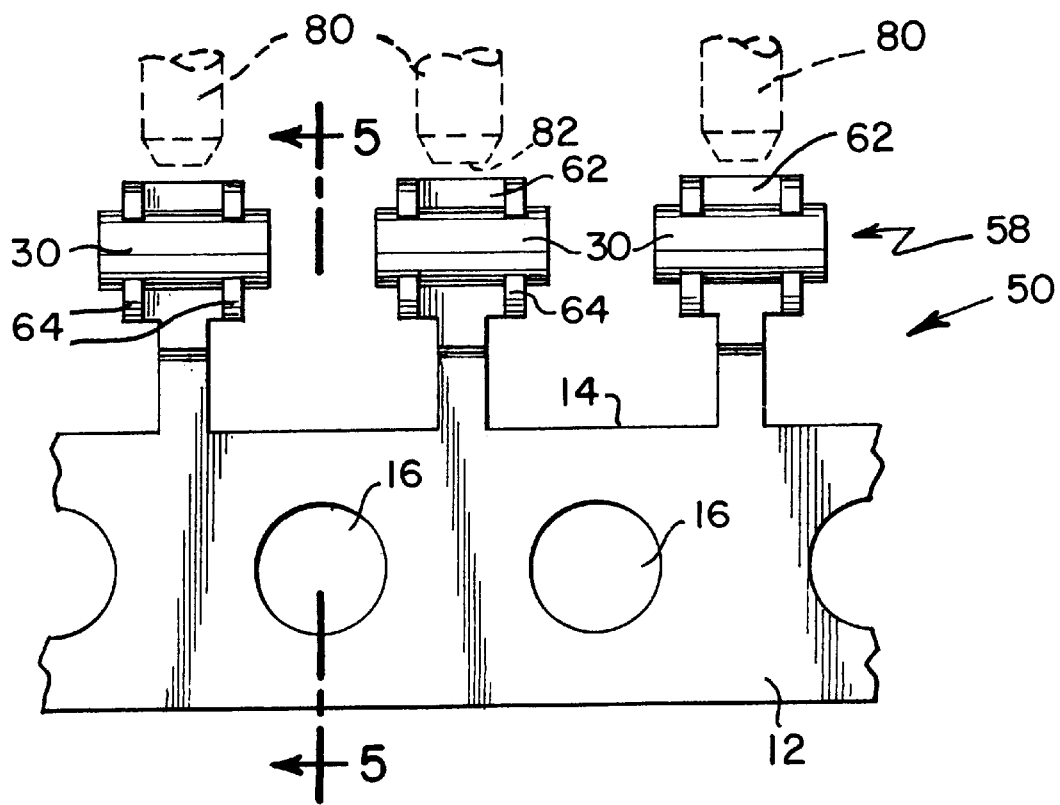
FIG. 4 is a plan view of a fragmentary length of a second solder-holding member having solder masses held thereby and for use according to the present invention.
Figure 5:
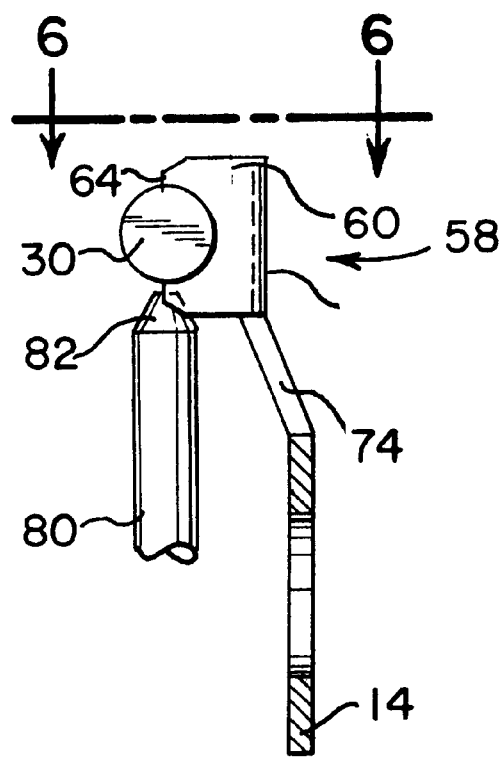
FIG. 5 is cross-sectional view of FIG. 4 taken along the line 5—5 thereof.
Figure 6:
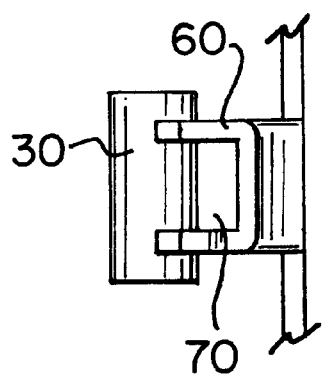
FIG. 6 is a fragmentary top view of the member of FIG. 4 viewed in the direction indicated by 6—6.

According to the present invention, there are a number of other types of solder-holding members besides the member 10 of FIG. 1 which may be used to form the solder ball 90 on each contact 80. For example, FIGS. 4–6 illustrate a solder-holding member 50 according to a second embodiment of the present invention. In this embodiment, the member 50 is shown in a first position and includes the long planar strip 12 which is formed of a non-wettable material as in the first embodiment. The carrier strip 12 is formed with a longitudinally extending carrier section 14 having customary indexing or sprocket holes 16 spaced along its length. The carrier strip 12 is integral with individual solder-holding clips 58 extending laterally therefrom at regular intervals therealong. Each solder-holding clip 58 is formed with a pair of sides 60 joined by a back 62. Each side 60 has a pair of fingers or tabs 64 extending partially around the solder mass 30 so as to securely grip and retain the solder mass 30. The sides 60 extending outwardly from the back 62 are spaced opposing one another so that a space 70 is formed between the sides 60 and also defined by the back 62. Again, the dimensions of the sides 60 and the back 62 are selected in view of the dimensions of the contact 80 which is used with the member 50.

The solder-holding member 50 is also adapted for multi-stage progressive stamping. In fabrication, an elongated strip of suitable material, e.g., aluminum or a plastic material, is stamped as shown in FIG. 4 to form the carrier strip 52 with the series of clips 58 extending laterally therefrom. The body is bent into the U-shape shown in FIG. 6 to form the clip sides 60 each with one pair of tabs or fingers 64. A solder wire (solder mass 30) of diameter conforming to the separation (space 70) of between the pairs of fingers 64 is laid between the pair of fingers 64, and the fingers 64 are then bent partially around and staked into the solder wire 30. The solder wire 30 is then cut between the clips 58, leaving an amount of solder appropriate for the use of the present invention as explained in greater detail hereinafter.

A connecting portion 74 serves to join the clip 58 to the carrier strip 12, and is bent with an offset as shown in FIGS. 5 and 6, so that when the member 50 is used with one or more contacts 80, interference is avoided between the contacts 80 and the carrier strip 12. The member 50 is used in a similar manner as member 10 of FIG. 1 to securely retain and position one solder mass 30 relative to one contact 80 so that the solder ball 90 (FIG. 24) may be formed at second end 82 during a reflow operation. As best shown in FIG. 4, the spacing between the clips 58 is correlated to the spacing between the terminal pins 80 so that in a use according to the present invention a section of the strip 12, having a number of clips 58 equal to the number of terminal pins 80, may be positioned relative to the terminals pins 80 so that ends 82 of the terminals pins 80 are disposed either above or below the solder masses 30 between the sides 60. FIG. 4 illustrates the contacts 80 being positioned above the solder masses 30, while FIG. 5 illustrates the contacts 80 being positioned below the solder masses 30.

For purpose of illustration only, the use of the member 50 to form the solder ball 90 at each second end 82 of the contact 80 will be described with reference to FIG. 5. In this embodiment, the second end 82 of the contact 80 is inserted into the space 70 between the sides 60. The second end 82 should be in close proximate relationship to the solder mass 30 just prior to solder reflow so that the solder mass 30 is permitted to flow into a spherical body surrounds the second end 82 of the contact 80. Because the solder mass 30 is only retained by the fingers 64 of each side 60, heating of the solder mass 30 causes the solder mass 30 to reflow. As with the first embodiment, the geometry of the member 50 and the positioning of the contact 80 permit the solder mass 30 to be driven into a spherical shape due to its natural flow characteristics, including the surface tension thereof. The non-wettable nature of the member 50 permits this solder reflow to occur. After cooling, each contact 80 has one solder ball 90 formed at its second end 82 as shown in FIG. 26. It will be understood that the contacts 80 form a part of the connector 300 as described with reference to FIGS. 26–27.

Figure 7:
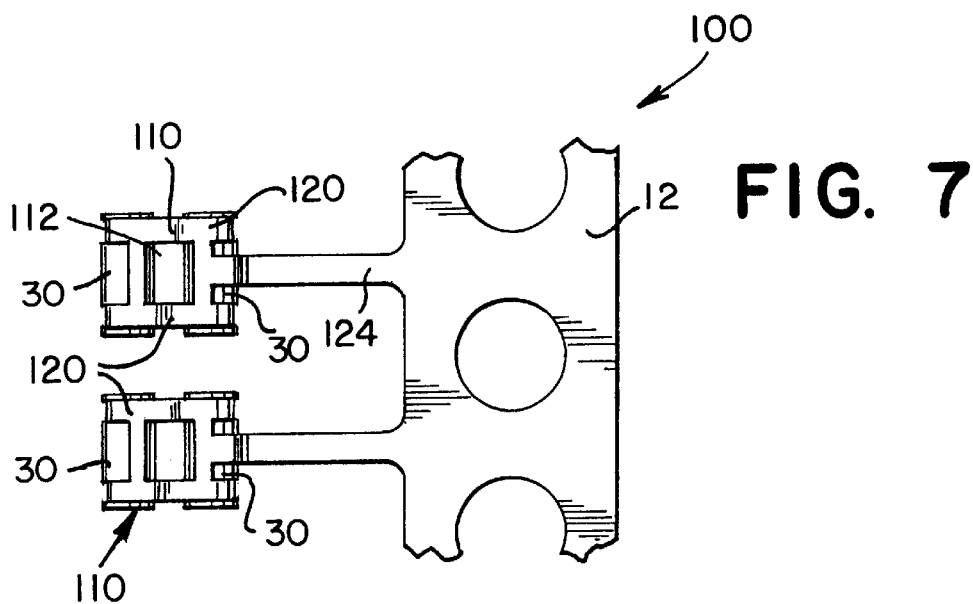
FIG. 7 is a bottom plan view of a fragmentary length of a third solder-holding member having solder masses held thereby and for use according to the present invention.
Figure 8:
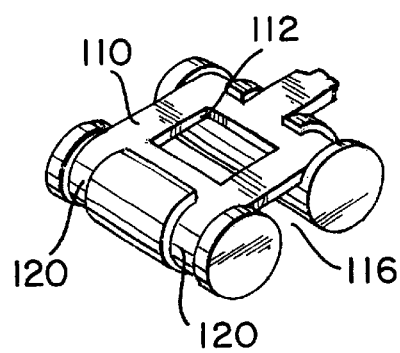
FIG. 8 is a perspective view of a portion of the member of FIG. 7.

FIGS. 7–8 show a third embodiment of a solder-holding member according to the present invention and generally indicated at 100. The member 100 is similar to the member 10 of FIGS. 1–3; however, as shown in FIG. 7, a clip 110 is provided with two pairs of fingers 120, with one pair of fingers 120 being located on the side of clip 110 adjacent the carrier strip 12, and the other pair of fingers 120 being located on the opposite side of the clip 110. The clip 110 has a general double I-shape, which may be formed by a progressive stamping operation or may be formed by another process when the member 100 is formed of a plastic material. A connecting member 124, e.g., a strip, connects each clip 110 to the carrier strip 12. Two solder masses 30 are positioned laterally across the two pairs of fingers 120. The solder masses 30 may be formed in much the same manner as the solder wire (FIG. 2).

Each pair of fingers 120 is then curled around the corresponding solder mass 30 to thereby securely retain the solder mass 30 (FIG. 8). A shown in FIG. 7, the solder masses 30 extend partially into a central opening 112 of the clip 110. The opening 112 is defined by the two fingers 120 and is sized so as to receive the contact 80 (FIG. 24). A space 116 may be present between the two facing solder masses 30 or the two solder masses 30 may be in intimate contact with one another with each solder mass 30 being securely held by one finger 120.

Now referring to FIGS. 7–8 and 24, as with the previous embodiments, the second end 82 of each contact 80 may be disposed either above the solder masses 30 or below the solder masses 30 during the reflow operation which results in the solder balls 90 being formed. When the second end 82 of each contact 80 is disposed above the solder masses 30, it is preferably positioned above the opening 112 and between the solder masses 30. As heat is applied to the member 100 and more specifically to the solder masses 30, the second end 82 is maintained in close relationship to the reflowing solder masses 30 so that the solder masses 30 flow into a spherical shape with the second end 82 being embedded therein. A cooling operation is then performed resulting in one solder ball 90 being formed at each second end 82 of the contact 80 as shown in FIG. 24.

Alternatively and preferably, the second end 82 of the contact 80 is disposed below clip 110 and more specifically, the second end 82 is positioned within the opening 112 below the solder masses 30. The solder masses 30 are then subjected to heat and based upon the geometry of the clip 110, the solder masses 30 are driven into a spherical shape (solder ball 90) which forms at the second end 82 of the contact 80.

Figure 9:
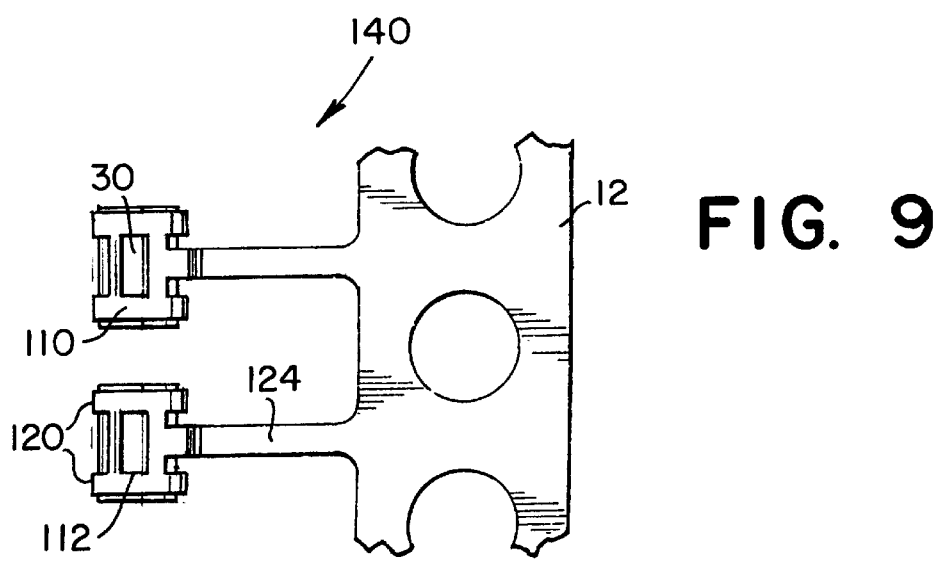
FIG. 9 is a bottom plan view of a fragmentary length of a fourth solder-holding member having solder masses held thereby and for use according to the present invention.

FIG. 9 shows a fourth embodiment of a solder-holding member 140 according to the present invention. The solder-holding member 140 is very similar to the member 100 of FIGS. 7–8 with the exception that it includes only one clip 110 which holds only one solder mass 30. In this embodiment, the solder mass 30 is preferably of sufficient size so that it extends across the entire opening 112, while being retained by the pair of fingers 120. The solder ball 90 (FIG. 24) is formed in much the same manner as that described with reference to the third embodiment of FIGS. 7–8.

Referring now to FIGS. 10–12, a solder-holding member 150 according to a fifth embodiment of the present invention is presented and shown in a first position. The solder-holding member 150 includes a carrier strip 12 having customary indexing or sprocket holes 14 spaced along its length. The carrier strip 12 is integral with individual clips 156 extending laterally therefrom at regular intervals therealong. Each clip 156 is formed of a pair of spaced fingers 158, 159 which are joined to the carrier strip 152 by separate connecting members 160, as will be described in greater detail hereinafter. Each finger 158, 159 has a first end 161 and a second end 163 with the fingers 158, 159 being spaced apart from one another in a generally parallel manner resulting in a space 165 being formed therebetween. One finger 158 of one clip 156 and one finger 159 of a next adjacent clip 156 are integrally connected at their first ends 161 to one connecting member 160, while the finger 159 of the one clip 156 is integrally connected to an adjacent connecting member 160 which is also integrally connected to another finger 158 of another clip 156. Near the second ends 163 of the fingers 158, 159 forming one clip 156, the fingers 158, 159 are connected so that a defined opening 169 is formed. More specifically, the opening 169 is defined by the opposing fingers 158, 159 and opposing intermediate members 170 which extend between and are preferably integrally formed with the fingers 158, 159 during the manufacture of the member 150, e.g., by a stamping operation.

On opposite sides of the opening 169, the fingers 158, 159 include bendable tabs 171 which are used to securely hold two opposing solder masses 30. The tabs 171 are preferably integral with the other members of the clip 156 with a first pair extending toward the carrier strip 12 and a second pair extending in the opposite direction away from the carrier strip 12. The tabs 171 are designed to be at least partially rolled around solder masses 30 so that the solder masses 30 are retained by the clip 156. As best shown in FIGS. 10 and 13, a portion of each solder mass 30 extends across the corresponding opening 169.

FIGS. 13–14 show the member 150 after heat has been applied to the solder masses 30 causing one solder ball 90 to be formed at each clip 156. As best shown in FIG. 14, the solder ball 90 is formed above the opening 169 and between the tabs 171. As with the other embodiments of the present invention, the member 150 has a proper geometry which permits the solder mass 30 to naturally form the solder ball 90 upon application of heat. FIGS. 15–16 show the member 150 after contacts 80 have been at least partially inserted into openings 169 of the clips 156 and the solder masses 30 have been reflowed to form the solder balls 90. It will be understood that the second ends 82 of the contacts 80 are inserted into the openings 169 prior to or concurrent with the heating of the solder masses 30 so that the natural reflow of the solder causes a portion of the solder to surround the second end 82 of one contact 80. In this manner, the second end 82 is disposed within the solder ball 90.

After forming the solder balls 90 at second ends 82 of the contacts 80, each contact 80 is separated from the member 150 by any number of techniques. The separation of the contact 80 from the member 150 should not cause the solder ball 90 to be deformed and also should not cause the bond between the contact 80 and the solder ball 90 to be weakened. For example, the first ends 161 of the fingers 158, 159 for each clip 156 may be cut and then the contact 80 may be directed upward through the opening 169 resulting in the solder ball carrying contact 80 being separated from the member 150. It is also preferred that the opening 169 be of sufficient size to permit the solder ball 90 to be passed therethrough as the contact 80 is directed downward away from the member 150. Alternatively, the contact 80 may be directed upward to remove it from the member 150. Because the member 150 is formed of a non-wettable material, the solder ball 90 does not adhere to the clip 156 during the entire heating and formation operation.

Figure 17:
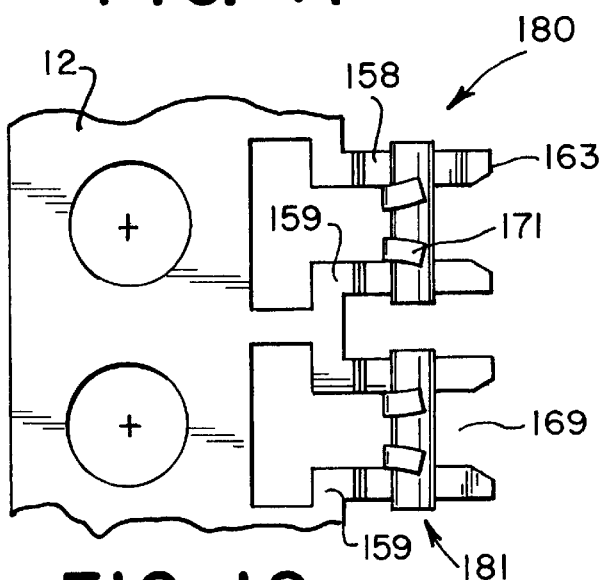
FIG. 17 is a plan view of a fragmentary length of a sixth solder-holding member having solder masses held thereby and for use according to the present invention.
Figure 18:
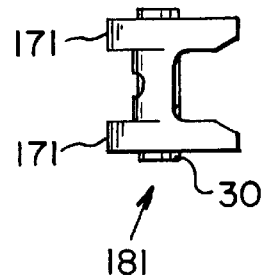
FIG. 18 is a fragmentary bottom plan view of the member of FIG. 17.

FIGS. 17–18 show a solder-holding member 180 according to a sixth embodiment of the present invention. In this embodiment, the solder-holding member 180 is similar to the member 150 with the exception that the fingers 158, 159 of each clip 181 are open at the second ends 163 thereof and only a single solder mass 30 is held by each clip 181. The single solder mass 30 is positioned across one intermediate member 170 and is held in place by a pair of tabs 171. The opening 169 is generally U-shaped with one end being completely open so that the contact 80 may be received within the opening 169 by directing the contact 80 between the fingers 158, 159 at this open end. As with the other embodiments, the member 180 is formed of a non-wettable material and in exemplary embodiments is formed of aluminum or from a plastic material as well as from other non-wettable materials, such as stainless steel and titanium.

Figure 19:
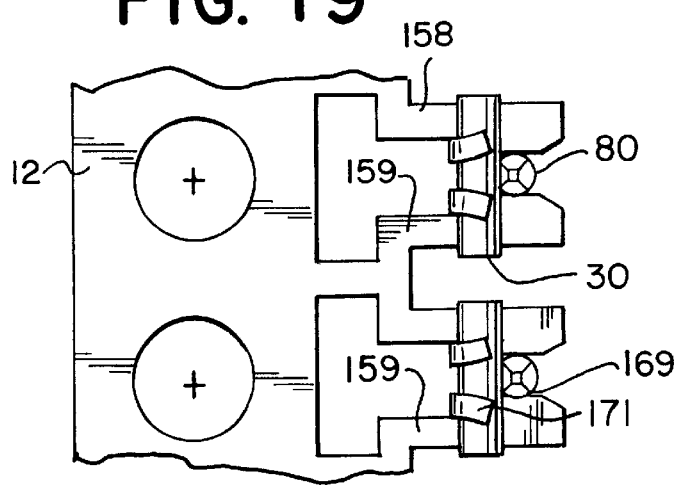
FIG. 19 is a plan view showing the member of FIG. 17 after a contact has been positioned relative thereto.
Figure 20:
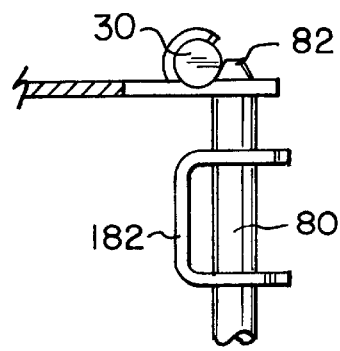
FIG. 20 is a side elevational view of the member of FIG. 19.

FIGS. 19–20 show the introduction of the contact 80 within the opening 169. In this embodiment, the contact 80 is of a bandolier type and includes a contact carrier 182. The carrier 182 is designed to releasably hold and retain the contact 80 in an upright, vertical position so that the second end 82 may be introduced into the opening 169 proximate to the solder mass 30. As shown in the FIGS., the second end 82 protrudes slightly above the fingers 158, 159 and is orientated so that during a solder reflow operation, the heated solder mass 30 is able to flow naturally into a spherical shape on top of the second end 82 of the contact 80. It will also be appreciated that the solder mass 30 may extend further across the opening 169 so that the second end 82 is actually positioned within the opening 169 slightly below the solder mass 30. A plurality of carriers 182 may be formed integral with one another to form a series of detachably connected carriers 182 where each carrier 182 is designed to releasably hold one contact 80.

Figure 21:
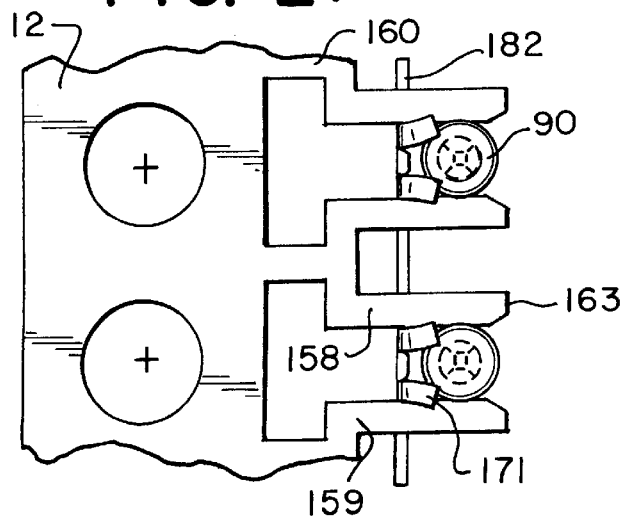
FIG. 21 is a plan view showing the member of FIG. 19 after solder reflow has formed a solder ball on each contact.
Figure 22:
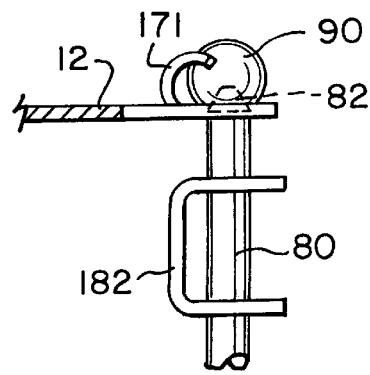
FIG. 22 is a side elevational view of the member of FIG. 21.

FIGS. 21–22 show the member 180 after the solder masses 30 have undergone a reflow operation resulting in the solder balls 90 being formed. As with the other embodiments, the member 180 has the proper geometry which permits the solder masses 30 to naturally reflow into spherical shapes (solder balls 90). One solder ball 90 is formed at each second end 82 of the contact 80. One advantage of the member 180 is that because the opening 169 has an entrance at one end, the solder ball carrying contact 80 may be easily removed from the member 180 after the solder ball 90 has been formed. Once the solder has cooled and formed the solder ball 90, the contact 80 may then be removed from member 180 very easily without deforming the formed solder ball 90 or weakening the bond between the solder ball 90 and the contact 80 because the solder ball 90 does not encounter any tabs 181 as it travels through the entrance of the opening at the second ends 163 of the fingers 158, 159.

It will be understood that the entire aforementioned process of forming solder ball 90 may be automated and computer controlled. In this instance, a controller (not shown) is programmed to grip and introduce the bandolier type contacts 80 into the opening 169 of the member 180 and then after application of heat and formation of the solder balls 90, the controller removes the contacts 80 from the member 180.

FIG. 23 shows the member 180 after the bandolier type contact 80 has been removed. As previously-mentioned, the solder-holding member 180 may be in the form of an aluminum stamping or it may comprise a plastic member. One will appreciate that the member 180 may be disposable or it may be reusable. Because the contact 80 is easily removed from the member 180 without damaging or altering the member 180, the member 180 is capable of being reused. When the member 180 is reused, a new solder mass 30 (FIG. 19) is simply disposed at each clip 156 underneath the tabs 171. New contacts 80 are then introduced into the opening 169 and the solder reflow operation is performed.

FIG. 24 shows the separation of the carrier 182 from the contact 80 after the solder ball 90 has been formed at the second end 82 thereof. The contact 80 is then used according to its intended purpose. For example, a number of solder ball carrying contacts 80 may be distributed as a package of loose contact pins or the contacts 80 may be disposed within connector 300 (FIG. 26).

In yet another aspect of the present invention, the member 180 may actually be part of a machine (not shown) instead of being a stamping. More specifically, a portion of the machine will have the structure of the member 180 and will be used as part of an automated process of forming the solder ball carrying contacts 80. The surfaces of the machine which resemble the member 180 have the necessary non-wettable properties and the tabs 171 are designed to be repeatedly used over and over so that all that is required is the continuous introduction of solder masses 30 into the machine and the continuous introduction and removal of contacts 80 from the machine after the solder balls 90 have been formed thereon. This type of set up provides an automated, cost effective and efficient method of forming solder ball carrying contacts 90 which may be used in SBGA connectors, e.g., connector 300 of FIG. 26, or may be used in other electrical connector applications where a solder ball carrying contact 80 is desired.

In FIG. 25, a solder and contact carrier device 350 is shown and includes a contact carrier 360 with a solder clip 370 being integrally formed with the contact carrier 360. As with the previous solder-holding members of the prior embodiments, the solder clip 370 contains solder ball forming geometry which permits a solder mass (not shown) to flow naturally into a spherical solder ball 90. This embodiment is similar to the embodiment illustrated in FIGS. 17–24 with the major difference being that the solder holding member 180 and the contact carrier 182 are formed as a single integral member.

The contact carrier 360 is generally C-shaped and has a slot (not shown) which frictionally receives the contact body 80, whereby the contact 80 may be easily and removed from the carrier 360. The slot is orientated so that the contact 80 is maintained in a vertical position. The solder clip 370 is integral with and extends upwardly from the carrier 360. The solder clip 370 is generally formed of a back portion 372 which is parallel to the contact 80 and includes a first end 374 integral with the carrier 360 and an opposing second end 376. The second end 376 of the back portion 372 has a pair of fingers 378 extending therefrom. The fingers 378 are formed substantially perpendicular to the back portion 372. A space is formed between the fingers 378 and is dimensioned so that the second end 82 of the contact 80 may be introduced thereinto. The solder clip 370 also includes a pair of bendable tabs 380 which are rolled over a portion of the solder mass, thereby securely retaining the solder mass to the clip 370.

Preferably, the solder mass at least partially extends across the space between the fingers 378. As with the other embodiments, the apparatus 350 has the desired solder ball forming geometry so that application of heat to the solder mass causes the solder to flow naturally into a spherical shape (solder ball 90). Because the second end 82 of the contact 80 is positioned within the space between the fingers 378, the solder reflow results in the solder surrounding the second end 82. The solder ball 90 is thus securely affixed to the second end 82 of the contact 80. After formation of the solder ball 90, the contact 80 is then removed from the carrier 360. It will be appreciated that the apparatus 350 is reusable by simply inserting a new contact 80 into the carrier 360 and a new solder mass is provided and retained by the clip 370.

The present invention provides a number of different types of solder-holding clip members which each possesses a desired solder ball forming geometry, whereby the heating of the solder material results in the formation of a spherical ball. This results because the clip-members are formed of a non-wettable material and each includes an opening formed therein which permits a contact to be at least partially inserted therein or orientated relative thereto, whereby the solder reflow operation causes the solder to flow onto an end of the contact and form the spherical solder ball thereat. By carefully tailoring the structure of the solder-holding clip member and by properly positioning the contact, the present invention takes advantage of the natural flow characteristics of solder material. Because of the surface tension of the material during the reflow operation along with other factors, the solder naturally flows into spherical balls. The formation of spherical solder balls at the ends of contacts is especially desirable in solder ball applications and finds particular utility in solder ball grid array (SBGA) connector applications.

Figure 28:
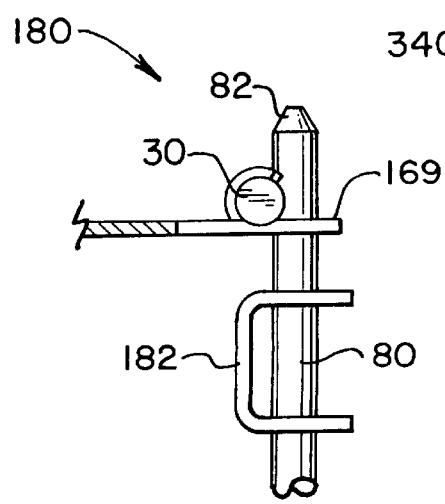
FIG. 28 is a side elevational view of the member of FIG. 20 showing the contact in an alternative position with the solder mass being adjacent to a portion of the contact.

FIGS. 28–29 show another aspect of the present invention. While this embodiment will be described with reference to member 180, it will be understood that any solder carrying member of the other embodiments of the present invention may be used to carry out this aspect of the present invention. In this embodiment, the contact 80 is positioned within the opening 169 so that the second end 82 fully extends through the opening 169 resulting in a first portion of the contact 80 being disposed above the clip 181 and a second portion being disposed below the clip 181. The solder mass 30 is thus adjacent to an intermediate portion of the contact 80.

FIG. 29 shows the formation of the solder ball 90 after a final reflow operation of the solder mass 30. During this reflow operation, the solder reflows naturally to form the spherical solder ball 90 with the difference being that in this embodiment, the solder ball 90 is not formed at the second end 82 but rather is formed at an intermediate location between the ends of the contact 80. The solder reflows around the contact 80 resulting in the solder ball 90 being formed such that the contact 80 extends through the solder ball 90 as illustrated. In this design, the ends of the contact 80 are located both above and below the solder ball 90.

FIGS. 30–31 show a connector 400 according to yet another embodiment of the present invention and more specifically, the connector 400 is of a SBGA type. The connector 400 includes a housing 410 having a plurality of openings 412 extending therethrough and arranged according to a predetermined pattern. The housing 410 has a first surface 414 and an opposing second surface 416. Preferably, the first and second surfaces 414, 416 are planar surfaces parallel to one another. The openings 412 receive the contacts 430. According to this embodiment, each contact 430 is formed of a body 432 having a first end 434 and a second end 436. A solder ball 90 is formed at each of the first and second ends 434, 436 using the method described hereinbefore with reference to the earlier embodiments.

More specifically, the solder balls 90 are formed at ends 434, 436 by positioning each end 434, 436 proximate to one of the solder-holding members of the present invention and then subjecting the solder masses (not shown) at each end 434, 436 to the solder reflow operation. This results in the solder naturally flowing into spherical bodies, thereby forming solder balls 90 at each end 434, 436. As with earlier embodiments, the contacts 430 may be loose when the solder balls 90 are formed and then inserted and fixed to the connector 400 or the contacts 430 may already be fixed to the connector 400 prior to forming the solder balls 90. In the later instance, the connector 400 is simply disposed between spaced solder-holding members (not shown) and then the final reflow operation is performed causing the solder to reflow and form the solder balls 90.

The solder balls 90 are formed at the ends 434, 436 such that each end 434, 436 is disposed within one solder ball 90. As best shown in FIG. 30, a portion of the formed solder ball 90 lies within the opening 412 and an opposite portion of the solder ball 90 lies outside of the opening 412 and beyond one of the first and second surfaces 414, 416. The contacts 430 are retained within the openings 412 by any number of techniques. For example, a longitudinal support member (not shown) may extend across each opening 412 with an opening being formed therein for frictionally receiving one contact 430.

FIG. 31 shows the connector 400 being used to electrically connect a first electronic device 450 to a second electronic device 460. The first electronic device 450 is preferably a planar device having a first surface 452 which includes a number of spaced contacts 454 formed thereon. In one exemplary embodiment, the first electronic device 450 is of a ball grid array (BGA) device type and the contacts 454 are surface mount solder pads in contact with electrical components of the device 450. The second electronic device 460 includes a substrate 462 having an integrated circuit (IC) formed thereon. The second electronic device 460 has a number of spaced contacts 464 formed thereon and arranged according to a predetermined pattern. The contacts 464 are also preferably surface mount solder pads which are electrically connected to the IC.

The connector 400 thus provides an electrical connection between a corresponding pair of contacts 454, 464. In other words, the number of contacts 430 preferably equals both the number of contacts 454, 464 and the arrangement of the contacts 430, 454, 464 is such that alignment results between the three contacts when the connector 400 is disposed between the devices 450, 460. FIG. 31 shows the connector 400 and the first and second electronic devices 450, 460 after each solder ball 90 has undergone the final reflow operation and has cooled. It will be understood that the solder balls 90 may or may not slightly deform during the final reflow operation, depending upon the precise application and operating conditions. Each of the contacts 454, 464 may have an amount of solder paste thereon to facilitate the bonding between the solder balls 90 and the contacts 454, 464 and in this instance, the solder paste is in part the material which reflows and bonds to the solder balls 90 during the final reflow operation.

The connector 400 provides the same advantages described earlier during the discussion of connector 300. For example and in yet another aspect, the contact 430 includes a compliant section 440 which permits the contact 430 to be a compliant lead because the likelihood the solder joints formed after the final reflow operation will fracture is reduced in comparison with the solder joint configurations of conventional devices. Conventional BGA connector designs do not provide compliancy to the joint or lead to compensate for the different coefficients of thermal expansion between the connector and each of the devices 450, 460. The compliant section 440 is a portion of the contact 430 which has been bent and along with the other features of the contact 430 permit the contact 430 to take up the thermal expansion which results during the heating of the devices 450, 460 and the connector 400 due to the difference between the coefficients of thermal expansion for each of these members.

Unlike in conventional BGA connectors, the contacts 430 have a range of motion because of their positioning within the housing 410. As shown in FIG. 30, the ends 434, 436 of the contact 430 are disposed such that the ends are permitted movement within the opening 412. The ends 434, 436 have a range of movement because they are not constrained within openings formed in the housing as in conventional connectors. Thus during the final reflow operation and the cooling thereafter, the contact 430 is permitted some range of movement and is designed to take up the thermal expansion. The bent section 440 assists in this take up as it permits the contact 430 to have greater movement within the opening 412. Thus, a more compliant lead is provided.

It will further be appreciated that the solder-holding conformations of the members of the present invention do not necessarily have to grip and hold the solder masses 30. Instead, the solder masses 30 may be otherwise disposed on the clip of the respective member so long as the solder mass 30 is located near the opening or slot which is used in the solder reflow operation. Use of some type of solder-holding conformation is preferred since it permits the solder mass 30 to be held in place prior to the solder reflow operation. It will be understood that the present invention is not limited to having the solder mass 30 securely retained by a member, such as the solder conformation, so long as the solder mass 30 is properly positioned on the clip and the solder naturally reflows into a spherical body.

Although a preferred embodiment has been disclosed for illustrative purposes, those skilled in the art will appreciate that many additions, modifications and substitutions are possible without departing from the scope and spirit of the invention.

What is claimed is:

1. A method of forming a solder ball on a contact, the method comprising:

providing the contact;

providing a solder-holding clip having a body with an opening, the body having a solder-holding conformation adjacent the opening and a solder mass positioned thereby, the solder-holding clip being formed of a non-wettable material;

positioning the contact proximate to the body opening;

reflowing the solder so that the solder flows into a spherical shape resulting in the solder ball being formed on a section of the contact; and separating the solder-holding clip from the contact.

2. The method of claim 1, wherein an end of the contact is inserted at least partially inserted into the body opening.

3. The method of claim 1, wherein the solder-holding conformation is adjacent a first side of the opening, the body being provided with a second solder-holding conformation adjacent a second side of the opening, the first side being substantially opposite the second side, the second solder-holding conformation having a second solder mass held thereby.

4. The method of claim 1, wherein the body has at least one finger integral with the body and adapted to hold the solder mass against the body.

5. The method of claim 1, wherein the body has a pair of fingers, one on each side of the opening, and a solder mass held by each of the fingers adjacent to the opening.

6. The method of claim 1, wherein at least a portion of the solder mass overlays the opening of the body.

7. The method of claim 1, further including:

overlaying the solder mass over at least a portion of the opening; and aligning the contact substantially underneath the solder mass so that during the solder reflow, the solder flows downward into the spherical shape with an end of the contact being disposed within the solder.

8. The method of claim 1, wherein the solder-holding conformation is detachably connected to a carrier strip portion of the body by a connecting member, the method further including:

separating the solder-holding conformation from the carrier strip by causing a break in the connecting member after the solder ball is formed on the contact; and removing the solder-holding conformation from the contact.

9. The method of claim 1, wherein the non-wettable material is a material selected from the group consisting of aluminum, titanium, stainless steel and a plastic material.

10. The method of claim 1, further including:

providing a contact carrier having a slot for receiving and detachably holding the contact;

inserting the contact into the contact carrier slot; and positioning the contact carrier so that an end of the contact is proximate to the body opening.

11. The method of claim 1, wherein the body has a pair of fingers, one on each side of the opening which is in the form of a slot between the fingers, the slot having an open end for receiving the contact, the contact being positioned between the open end of the slot and the solder-holding conformation which holds the solder mass across the slot.

12. The method of claim 1, wherein the solder mass forms one edge of the opening.

13. The method of claim 1, wherein the contact comprises a terminal pin.

14. The method of claim 1, wherein the solder mass is held by the solder-holding conformation.

15. The method of claim 1, wherein the section of the contact where the solder ball is formed is an end of the contact which is positioned proximate to the body opening.

16. A method of forming a solder ball on a contact, the method comprising:

providing the contact;

providing an apparatus having a solder-holding clip formed integrally as part thereof, the clip having a body with an opening, the body having a solder-holding conformation adjacent the opening and a solder mass positioned by the conformation, the solder-holding clip being formed of a non-wettable material;

positioning a section of the contact proximate to the body opening; and reflowing the solder so that the solder flows into a spherical shape resulting in the solder ball being formed on the section of the contact; and removing the contact from the apparatus.

17. The method of claim 16, wherein positioning the end of the contact comprises:

at least partially inserting the end of the contact into the opening of the body.

18. The method of claim 16, wherein the apparatus is an automated machine.

19. The method of claim 16, wherein the body has at least one finger integral with the body and adapted to hold the solder mass against the body.

20. The method of claim 16, wherein the section of the contact where the solder ball is formed is an end of the contact which is positioned proximate to the body opening.

21. A method of forming solder balls at first ends of an array of contacts disposed in a connector according to a predetermined spaced arrangement, the method comprising:

providing the connector;

providing an elongated strip of material with a longitudinally extending section of the strip providing a carrier strip, the strip having an array of clips integral with the carrier strip and spaced along the carrier strip, each clip having a body portion with an opening formed therein, the body having a solder-holding conformation adjacent each opening and a solder mass held by the conformation, wherein at least the solder-holding clips are formed of a non-wettable material;

positioning the first end of each contact proximate to a corresponding body opening;

reflowing the solder masses so that the solder flows into a spherical shape at each clip resulting in one solder ball being formed at the first end of each contact; and separating the connector from the array of clips.

22. The method of claim 21, wherein positioning the end of the contact comprises:

at least partially inserting the end of the contact into the opening of the body.

23. The method of claim 21, further including:

overlaying the solder mass over at least a portion of the opening; and aligning the contact substantially underneath the solder mass so that during the solder reflow, the solder flows downward into the spherical shape with an end of the contact being embedded within the solder.

24. The method of claim 21, wherein the non-wettable material is a material selected from the group consisting of aluminum, titanium, stainless steel and a plastic material.

25. The method of claim 21, wherein the connector includes a housing with the contacts being disposed perpendicularly within the housing.

26. The method of claim 21, wherein the contacts comprise terminal pins.

27. A method of forming a connector having a body with an opening for receiving a contact, the method comprising:
   providing the contact;
   providing a solder-holding clip having a body with an opening formed therein, the body having a solder-holding conformation adjacent the opening and a solder mass held by the conformation, wherein at least the solder-holding clip is formed of a non-wettable material;
   positioning a section of the contact proximate to the body opening;
   reflowing the solder so that the solder flows into a spherical shape resulting in the solder ball being formed on the section of the contact;
   separating the solder-holding clip from the contact; and
   inserting and retaining the contact within the opening of the connector.

28. The method of claim 27, wherein the section of the contact comprises an end thereof and positioning the end of the contact comprises:
   at least partially inserting the end of the contact into the opening of the body.

29. The method of claim 27, further including:
   overlaying the solder mass over at least a portion of the opening; and
   aligning the contact substantially underneath the solder mass so that during the solder reflow, the solder flows downward into the spherical shape with an end of the contact being disposed within the solder.

30. The method of claim 27, wherein the non-wettable material is a material selected from the group consisting of aluminum, titanium, stainless steel and a plastic material.

31. The method of claim 27, wherein the connector is a solder ball grid array (SBGA) connector and includes a plurality of contacts, each contact having one solder ball affixed to one end, the contacts being generally parallel to one another.

32. The method of claim 27, wherein one solder ball is formed at each end of the contact.

33. A method of forming a solder ball at an end of a contact, the method comprising:
   providing the contact;
   providing a solder-holding contact carrier having a contact holding section which includes a slot for receiving the contact and a solder-holding clip section integrally formed with the contact holding section, the solder-holding clip section including a body having an opening formed therein, the opening being axially aligned with the slot of the contact carrier so that the contact may be inserted and held within the slot with an end of the contact being proximate to the opening, the clip section having a solder-holding conformation adjacent the opening and a solder mass held by the conformation, wherein at least the solder-holding clip section is formed of a non-wettable material;
   inserting the contact into the slot so that the end is proximate to the opening;
   reflowing the solder so that the solder flows into a spherical shape resulting in the solder ball being formed at the end of the contact; and
   removing the contact from the contact carrier.

34. The method of claim 33, wherein the end of the contact is at least partially inserted into the opening.

35. The method of claim 33, wherein the solder-holding clip section includes a pair of spaced fingers with the opening being formed therebetween, the opening having an entrance at one end which permits the end of the contact to be received between the fingers.

36. The method of claim 33, wherein the contact is disposed between the solder-holding conformation and the entrance of the opening.

37. The method of claim 33, wherein the solder ball is affixed to the end of the contact by having the end embedded within the solder ball.

38. A method of forming a solder ball at an end of a contact, the method comprising:
   providing the contact;
   providing a solder-holding clip formed of a non-wettable material, the clip including a body having an opening formed therein, the body having a solder-holding conformation adjacent the opening and a solder mass positioned by the conformation;
   positioning the end of the contact proximate to the body opening;
   reflowing the solder so that the solder flows into a spherical shape resulting in the solder ball being formed at the end of the contact;
   removing the contact from the solder-holding clip; and
   wherein the clip has a geometry which permits the solder mass to reflow naturally into a spherical shape above the body opening, thereby forming the solder ball, the solder ball being affixed to the contact end due to the contact end being embedded within the solder ball after the solder has cooled.

39. The method of claim 38, wherein the positioning of the contact comprises:
   at least partially inserting the end of the contact into the opening of the body.

40. The method of claim 38, wherein removing the contact comprises:
   partitioning the solder-holding clip into first and second sections, the second section including a portion of the body containing the opening and the solder-holding conformation, the second section being disposed around the end of the contact; and
   removing the contact from the second section.

41. The method of claim 38, wherein the opening is in the form of a slot having an open entrance and removing the contact comprises:
   maintaining the solder ball above the body while directing the end of the contact through the slot until the contact and solder ball clear the clip.

42. The method of claim 38, wherein the solder mass is held by the conformation.

43. A contact produced in accordance with the method of claim 1.

44. The contact of claim 43, wherein the contact is integrally formed with a strip of material.

45. The contact of claim 43, wherein the contact is a terminal pin.

46. A solder ball grid array (SBGA) connector having a plurality of contacts, each contact being produced in accordance with the method of claim 1.

47. A method of forming a solder ball on a contact, the method comprising:

provising the contact;

providing a solder-holding structure having a surface which supports a solder mass;

retaining the solder mass on the surface which is formed of a non-wettable material;

positioning the contact proximate to or in partial contact with the solder mass; and reflowing the solder mass so that the solder mass flows into a spherical shape resulting in the solder ball being formed on a section of the contact.

48. The method according to claim 47, wherein the non-wettable material is selected from the group consisting of aluminum, titanium, stainless steel and a plastic material.

49. The method according to claim 47, wherein the contact comprises a terminal pin and the solder ball is formed at one end thereof.

* * * * *